(12) United States Patent
Amano (10) Patent No.: US 6,906,590 B2
(45) Date of Patent: Jun. 14, 2005

(54) FET AMPLIFIER WITH TEMPERATURE-COMPENSATING CIRCUIT

(75) Inventor: Shigeru Amano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/350,136

(22) Filed: Jan. 24, 2003

(65) Prior Publication Data

US 2003/0141931 A1 Jul. 31, 2003

(30) Foreign Application Priority Data

Jan. 29, 2002 (JP) ........................................ 2002-020320

(51) Int. Cl.[7] ................................................ H03F 3/16
(52) U.S. Cl. ...................................... 330/277; 330/289
(58) Field of Search ................................ 330/277, 289, 330/296

(56) References Cited

U.S. PATENT DOCUMENTS 5,506,544 A  *  4/1996  Staudinger et al.  .........  330/277
6,548,840 B1 *  4/2003  Pobanz et al.  ...............  257/252

FOREIGN PATENT DOCUMENTS

JP          57-157606 A      9/1982
JP          4-317205 A       11/1992

* cited by examiner

*Primary Examiner*—Steven J. Mottola
(74) *Attorney, Agent, or Firm*—Sughrue Mion, PLLC (57) ABSTRACT

A FET amplifier which minimizes the worsening of the distortion-susceptibility due to variations in the ambient temperature of operation is to be provided. An LDMOS FET 1, whose source terminal is grounded and to which are applied a gate voltage Vgs from a gate bias terminal 3 via a temperature-compensating circuit 2 and a choke coil and a drain voltage Vds from a drain bias terminal 4 via a choke coil operates as a source-grounded type amplifier. In the temperature compensating circuit 2, the resistances of fixed resistance elements 21 and 22 connected in parallel are set to be the same or have the same number of digits, and those of thermosensitive resistance elements (thermistors) 23 and 24 are set to be a combination of a value greater by one digit and a value smaller by one digit than that of the fixed resistance element 21 or the fixed resistance element 22 at the standard level (+25° C.) in the ambient temperature range of operation.

7 Claims, 11 Drawing Sheets

| Ta (°C) | Rp1 | Rp2 | Rp1+Rp2 |
|---|---|---|---|
| -40 | Ra/2 | Ra | ~1.5Ra |
| +25 | Ra/10 | Ra | ~Ra |
| +120 | Ra/100 | Ra/2 | 0.5Ra |

FET AMPLIFIER WITH TEMPERATURE-COMPENSATING CIRCUIT

BACKGROUND OF THE INVENTION

1. Field of the Invention

The present invention relates to a FET amplifier, and more particularly to a FET amplifier capable of minimizing the degradation of distortion in the output power due to temperature variations in the operating ambience.

2. Description of the Related Prior Art

As a device for use in a high-output amplifier in microwave band communication apparatuses, an LDMOS FET (lateral diffused MOS field effect transistor) is being increasingly adopted. This device has an advantage of having better output distortion characteristics than a GaAs FET (gallium arsenide field effect transistor) which can generally provide a high output more easily. For this reason, it is suitable for use in wireless base stations of the W-CDMA (Wideband Coded Division Multiple Access) type. At the same time, this device has a disadvantage that its operating current (drain current) greatly varies with the ambient temperature of operation and its susceptibility to distortion also greatly varies with the fluctuations of this drain current.

Even if the drain current is set to a certain amperage at the normal temperature, the amperage of the drain current will vary if the ambient temperature varies. As a result, a wide difference may arise between the consumed amperage at the normal temperature and that at a lower or higher temperature, and this would be undesirable for reducing power consumption by the system.

As the distortion-susceptibility of a LDMOS FET is highly sensitive to the drain current and its sweet spot is narrow, it may greatly vary with an up or down in ambient temperature. From the viewpoint of suppressing the distortion-susceptibility, in order to use an LDMOS FET in a broad temperature range, it is necessary either to choose a device having a higher output capacity than is required or to perform temperature compensation with an external circuit.

Thus, for an amplifier using an LDMOS FET, temperature compensation of the gate voltage is an indispensable technique from the viewpoint of reducing its power consumption, size and cost. In order to maintain the distortion-susceptibility of an LDMOS FET amplifier at the optimum point within the ambient temperature range of operation, it is indispensable to control the gate voltage Vgs so as to keep the drain current Ids constant.

Figure 1:
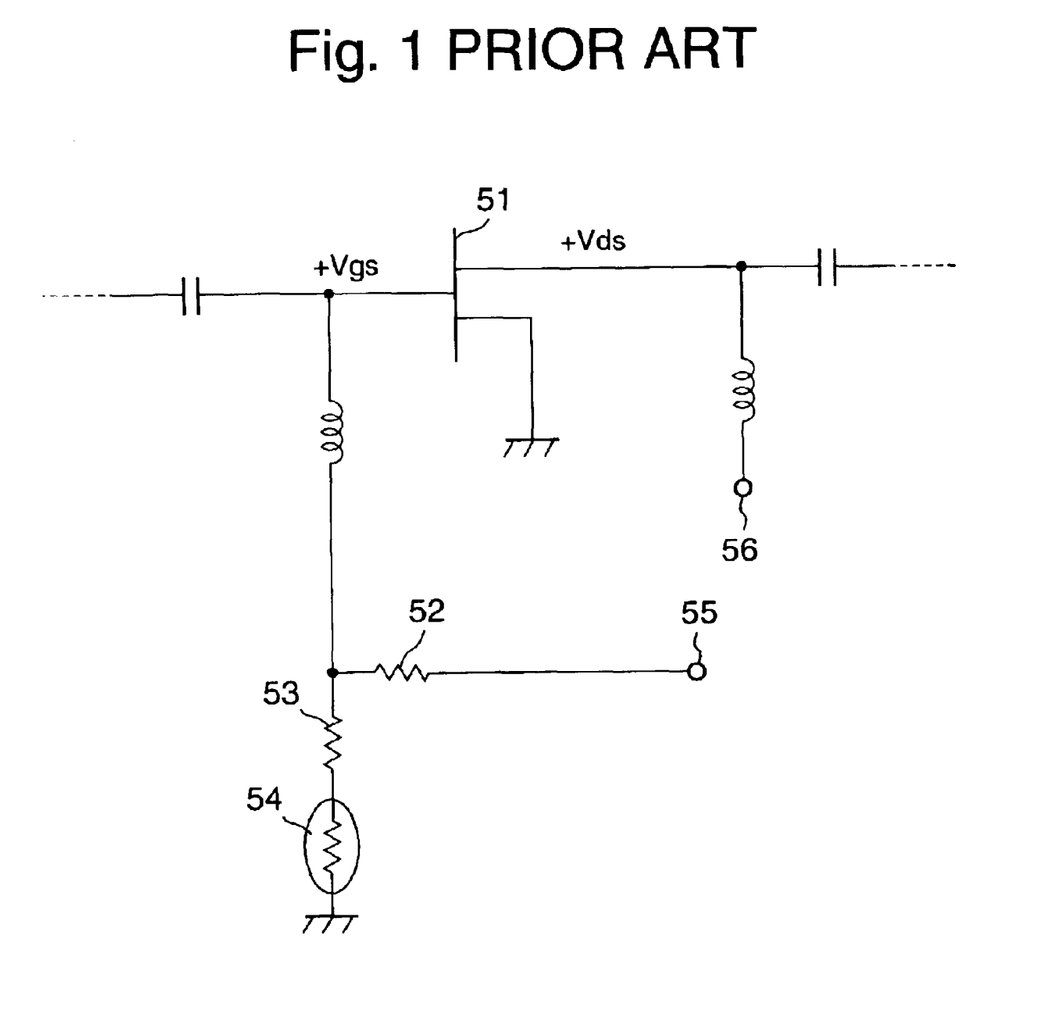
FIG. 1 illustrates a FET temperature-compensating circuit using a thermistor according to the prior art.

An example of the prior art to compensate this gate voltage of the FET is disclosed in the Japanese Patent Application Laid-Open No. Sho 57-157606. FIG. 1 illustrates one example of external temperature-compensating circuit according to the prior art.

The circuit of the prior art shown in FIG. 1 includes a thermistor 54 in part of a voltage dividing circuit for supplying the gate voltage, and is so configured as to subject the gate voltage Vgs, to be applied to a FET 51, to temperature compensation by utilizing temperature-dependent variations in the resistance of the thermistor.

The temperature range permitting linear compensation of the gate voltage Vgs in this temperature-compensating circuit is around 30° C. If the ambient temperature is supposed to range from –10° C. to +80° C. in view of the likely application to communication apparatuses, it is difficult to compensate the gate voltage in a broad temperature range with the temperature-compensating circuit shown in FIG. 1 because the temperature-dependent variations in the resistance of the thermistor in this temperature range are by at most two digits.

Figure 2:
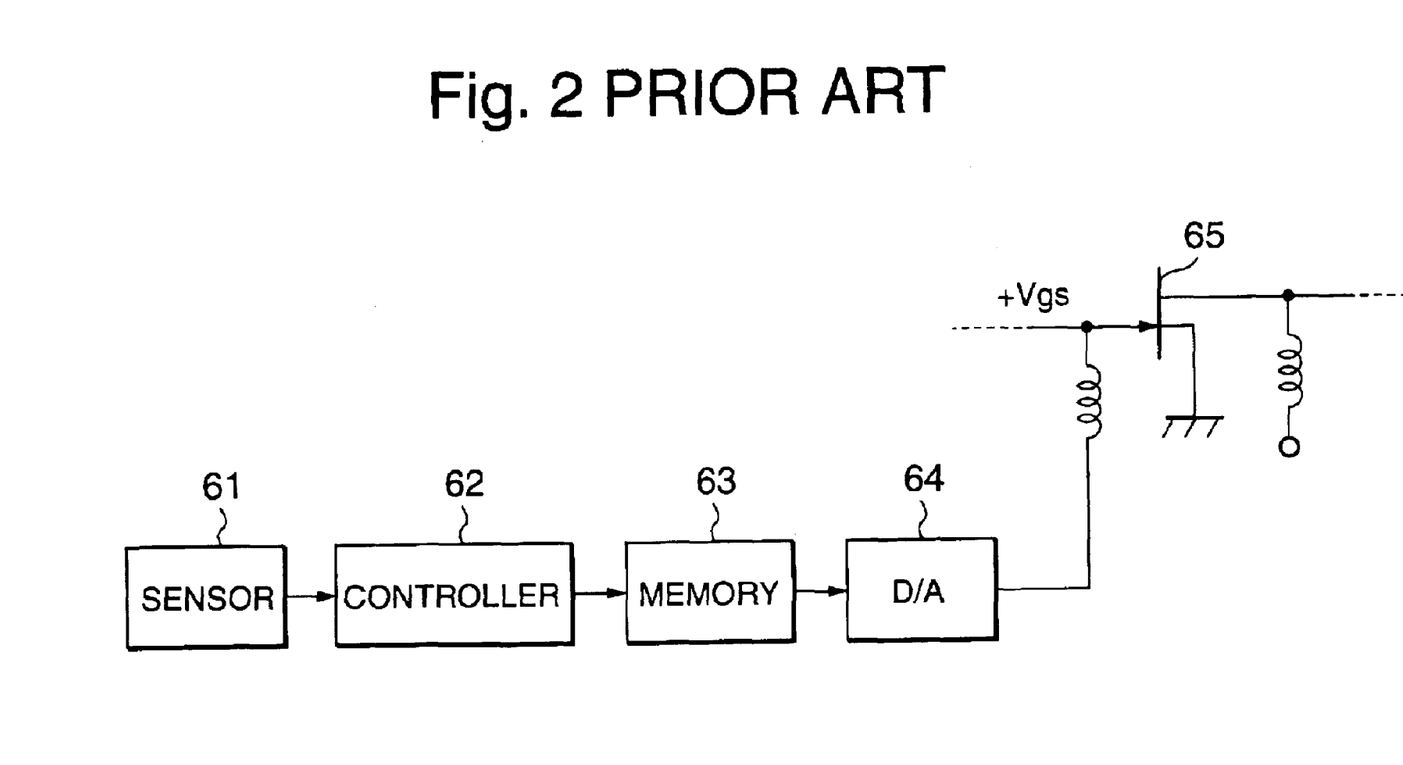
FIG. 2 is another FET temperature-compensating circuit according to the prior art.

An example of the prior art permitting temperature compensation in a broad range is disclosed in the Japanese Patent Application Laid-Open No. Hei 4-317205. FIG. 2 illustrates another example of LDMOS FET-based temperature-compensating circuit according to the prior art.

With reference to FIG. 2, gate voltage data matching the ambient temperature of operation are stored in a memory 63 in advance, and a controller 62 provides the output of a temperature sensor 61 to the memory 63 as an address signal and reads the gate voltage data out of the memory 63. A D/A converter 64 subjects to D/A conversion the gate voltage data that have been read out and applies the converted data to a FET 65 as the gate voltage.

However, this example of the prior art requires such circuits as an operational amplifier, controller and a memory among others in addition to the temperature sensor, and accordingly invites an increase in circuit dimensions and cost.

SUMMARY OF THE INVENTION

An object of the present invention attempted in view of the problems noted above, therefore, is to provide a FET amplifier cleared of the above-described shortcomings of the LDMOS FET temperature-compensating circuits according to the prior art and capable of minimizing the worsening of the distortion-susceptibility dependent on temperature variations in the operating ambience by linear temperature compensation of the gate voltage.

A FET amplifier with temperature-compensating circuit according to the invention is a FET amplifier provided with a circuit, using a FET as its amplifying element, for subjecting the gate voltage of the FET element to temperature compensation, and this temperature-compensating circuit compensates the gate voltage so as to keep the drain current of the FET element at a prescribed amperage against variations in ambient temperature.

The prescribed amperage of the drain current is an amperage that minimizes third order cross modulation distortion in the output power of the FET amplifier.

The temperature-compensating circuit may be provided with a resistance circuit in which a first parallel circuit formed by a first fixed resistance element whose resistance does not vary dependent on the temperature and a first thermosensitive resistance element whose resistance does vary dependent on the temperature and a second parallel circuit formed of a second fixed resistance element and a second thermosensitive resistance element are connected in series, and a third fixed resistance element, wherein a voltage divided by the resistance circuit and the third fixed resistance element is applied as the gate voltage. Further, the first fixed resistance element and the second fixed resistance element may have either the same resistance or resistances of the same number of digits, the resistance of the first thermosensitive resistance element at the normal temperature is smaller than that of the first fixed resistance element by one digit, and the resistance of the second thermosensitive resistance element at the normal temperature is greater than that of the second fixed resistance element by one digit.

The first thermosensitive resistance element and the second thermosensitive resistance element may be thermistors.

The amplifying element of the FET amplifier may be an LDMOS FET (lateral diffused MOS field effect transistor).

The compensable temperature range may be at least from −10° C. to +80° C.

The FET amplifier with temperature-compensating circuit according to the invention has the advantage of being capable of keeping the drain current amperage of the LDMOS FET amplifier constant and thereby minimizing the worsening of the distortion-susceptibility by being provided with a circuit network in which at least two stages of a pair of a fixed resistance element and a thermosensitive resistance element each connected in parallel are connected in series in a gate bias circuit.

BRIEF DESCRIPTION OF THE DRAWINGS

The above and other objects, features and advantages of the present invention will become apparent from the following detailed description when taken in conjunction with the accompanying drawings in which.

DETAILED DESCRIPTION OF THE PREFERRED EMBODIMENT

Figure 3:
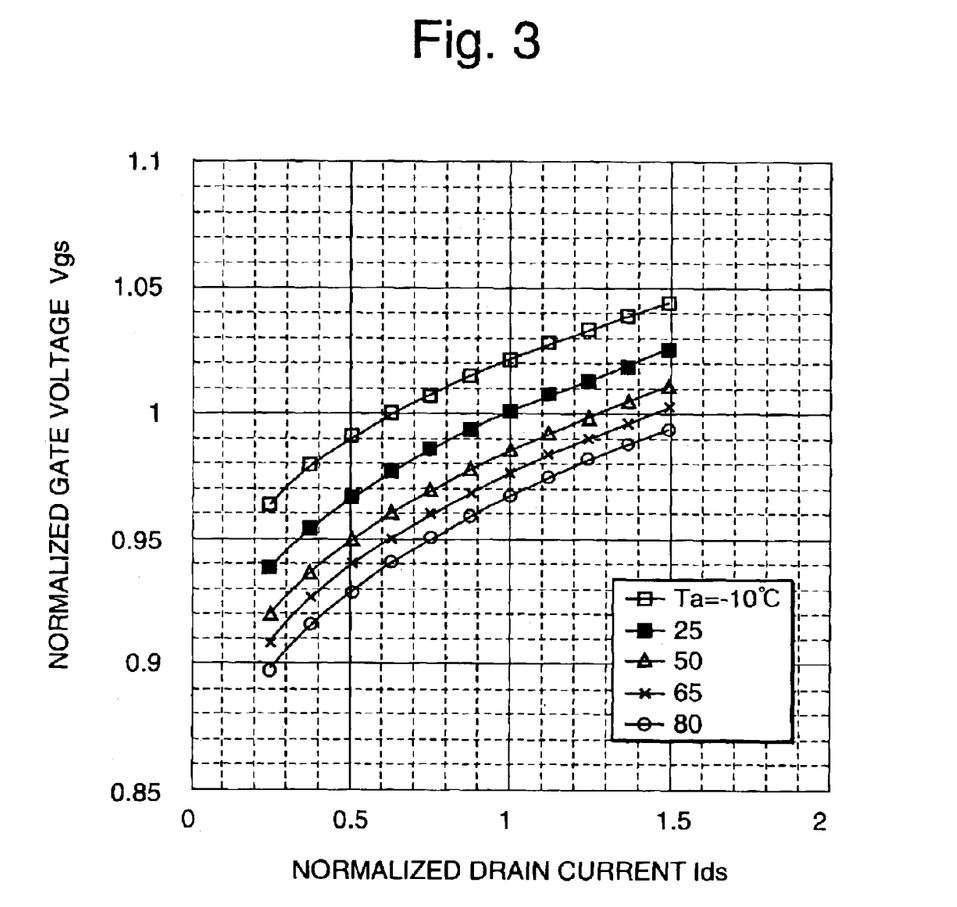
FIG. 3 is a characteristic diagram showing variations in drain current relative to the gate voltage of an LDMOS FET when the ambient temperature of operation is kept constant.

First will be explained variations in drain current dependent on the ambient temperature of operation of an LDMOS FET. FIG. 3 is a characteristic diagram showing variations in drain current relative to the gate voltage with the ambient temperature Ta of operation as the parameter. Vgs and Ids are normalized with their respective values at Ta=1+25° C. According to FIG. 4, if Vgs is fixed at abnormal value of 1, i.e. if no temperature compensation is applied, the drain current Ids will fluctuate as much as from −38% at Ta=−10° C. to +71% at Ta=+80° C.

Figure 4:
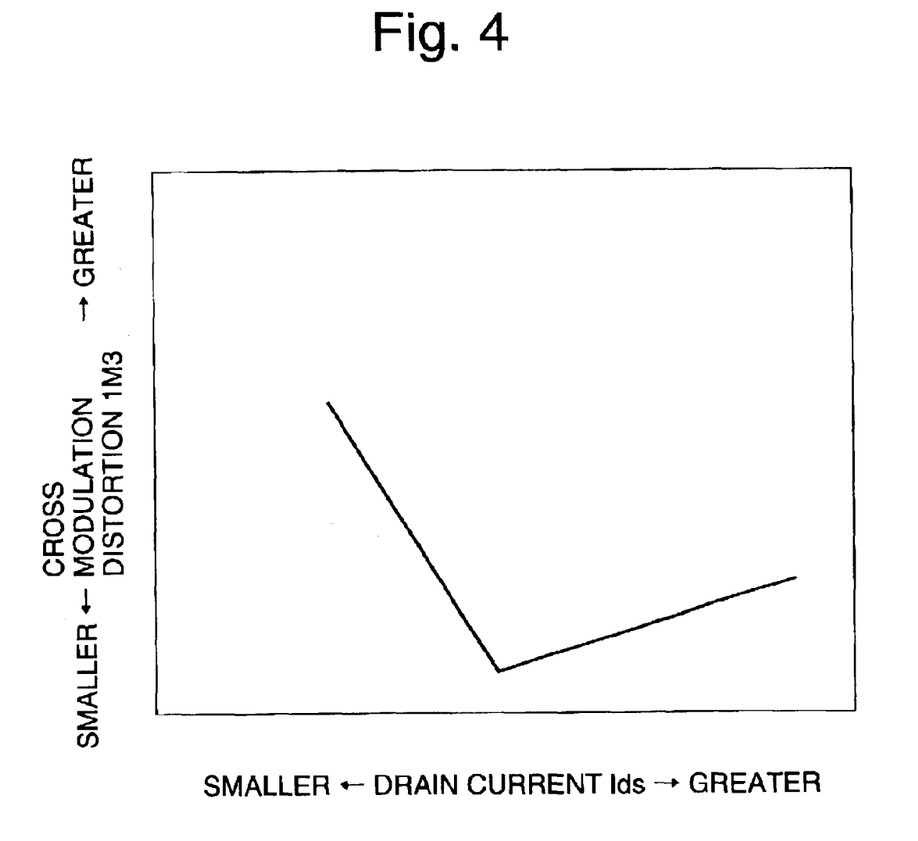
FIG. 4 shows the characteristic of third order cross modulation distortion relative to the drain current of the LDMOS FET amplifier.

Next will be explained the distortion-susceptibility of the LDMOS FET. FIG. 4 illustrates an example of the characteristic of third order cross modulation distortion (IM3) of the LDMOS FET. As FIG. 4 shows, there is a value of the drain current Ids at which IM3 is minimized (optimized), and IM3 steeply rises as this drain current Ids drops. Therefore, even if the distortion-susceptibility is set at the optimal point at the standard the ambient temperature of operation (Ta=+25° C.), under a condition where the gate voltage Vgs is fixed, the distortion-susceptibility will deviate from the optimal point and worsen on the lower temperature side, where the ambient temperature of operation is low, with a decrease in drain current Ids.

Figure 5:
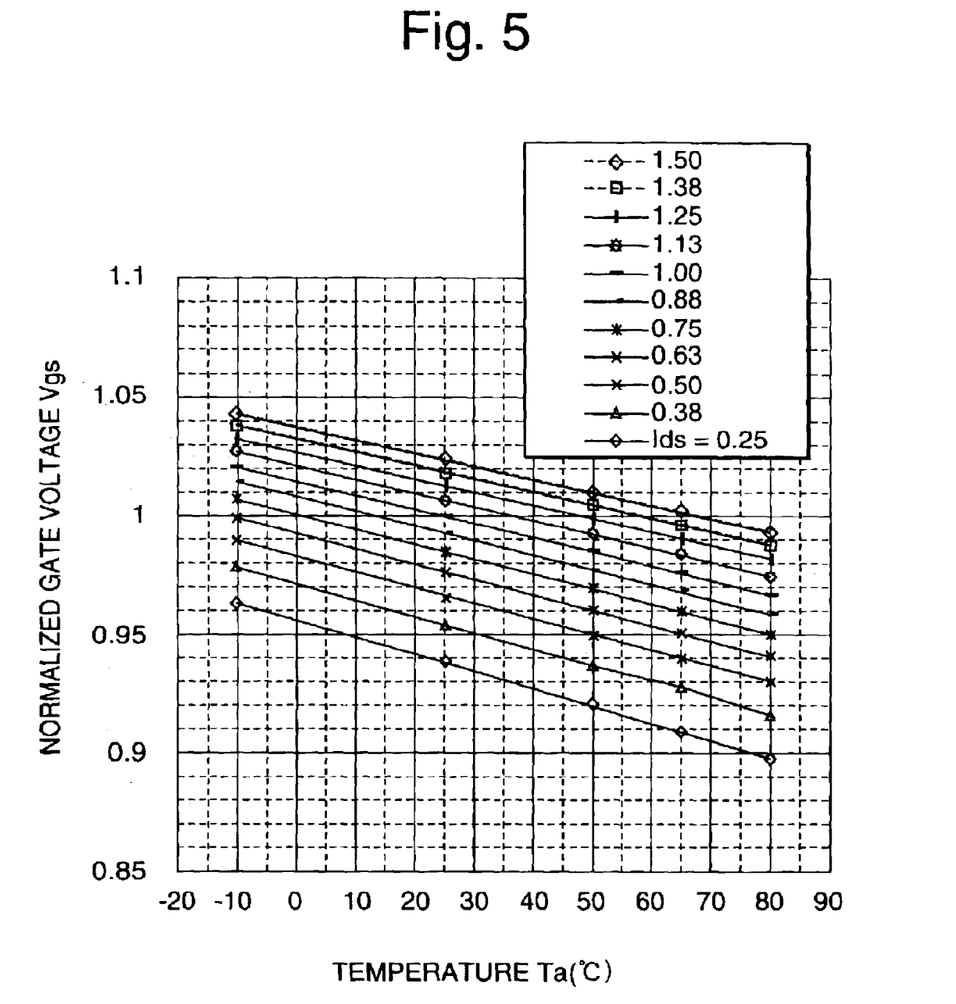
FIG. 5 shows necessary variations in gate voltage for keeping the drain current constant all the time irrespective of the ambient temperature of operation.

It is seen from the foregoing that, in order to keep the distortion-susceptibility of the LDMOS FET amplifier at its optimal point in the ambient temperature range of operation, it is indispensable to so control the gate voltage Vgs as to keep the drain current Ids constant. FIG. 5 is a characteristic diagram, which is a modified version of FIG. 3, showing the variations in gate voltage to keep the drain current constant all the time irrespective of variations in the ambient temperature of operation. FIG. 5 reveals that the drain current Ids can be kept constant in a broad ambient temperature range of operation by subjecting the gate voltage Vgs to primary (linear) compensation relative to the ambient temperature of operation.

Figure 6:
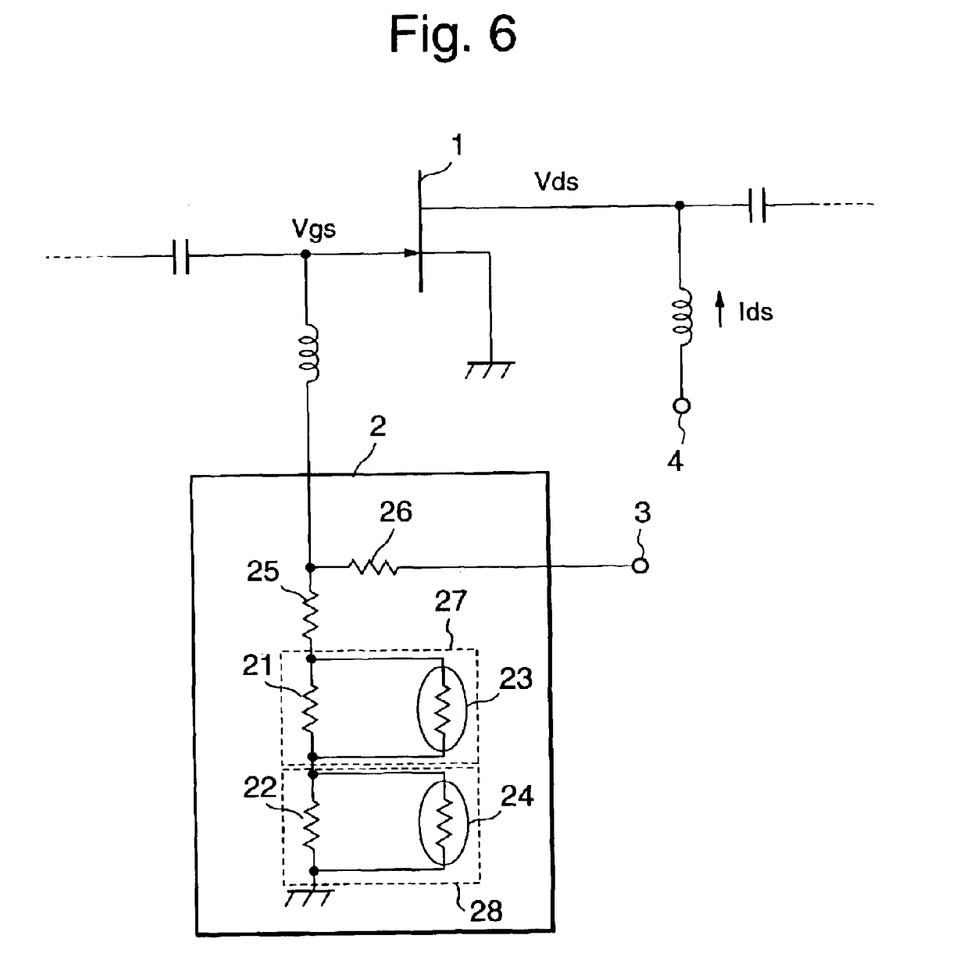
FIG. 6 illustrates an LDMOS FET amplifier having a temperature-compensating circuit according to the invention.

Next will be described a preferred embodiment of the present invention with reference to a drawing. FIG. 6 is a block diagram illustrating a FET amplifier in one mode of carrying out the invention.

The embodiment of the invention shown in FIG. 6 consists of an LDMOS FET 1 and a temperature-compensating circuit 2. The temperature-compensating circuit 2 is configured of a circuit in which a first parallel connection 27 of a fixed resistance element 21 and a thermosensitive resistance element 23 and a second parallel connection 28 of a fixed resistance element 22 and a thermosensitive resistance element 24 are connected in series and fixed resistance elements 25 and 26.

Next will be described the operation of the FET amplifier in this mode of implementing the invention.

Referring to FIG. 6, to the LDMOS FET 1, whose source terminal is grounded, is applied a gate voltage Vgs from a gate bias terminal 3 via the temperature-compensating circuit 2 and a choke coil. Further, a drain voltage Vds is applied from a drain bias terminal 4 via a choke coil.

The circuit shown in FIG. 6 operates as a source-grounded type amplifier. The gate voltage Vgs of the LDMOS FET is a value resulting from the division of the voltage applied to the gate bias terminal by the serial circuit of the fixed resistance elements 25 and 26 and the two parallel connections.

The resistances of the fixed resistance elements and thermosensitive resistance elements constituting the first and second parallel connections of the temperature-compensating circuit 2 are set as follows. The resistances of the fixed resistance elements 21 and 22 are set to be the same or have the same number of digits, and those of the thermosensitive resistance elements 23 and 24 are set to be a combination of a value greater by one digit and a value smaller by one digit than that of the fixed resistance element 21 or the fixed resistance element 22 at the standard level (+25° C.) in the ambient temperature range of operation. The resistances of the fixed resistance elements 25 and 26 are appropriately set so as to control the gate voltage of the LDMOS FET 1 for proper temperature compensation.

Next will be described the temperature compensating operation in this mode of implementing the invention.

Figure 7:
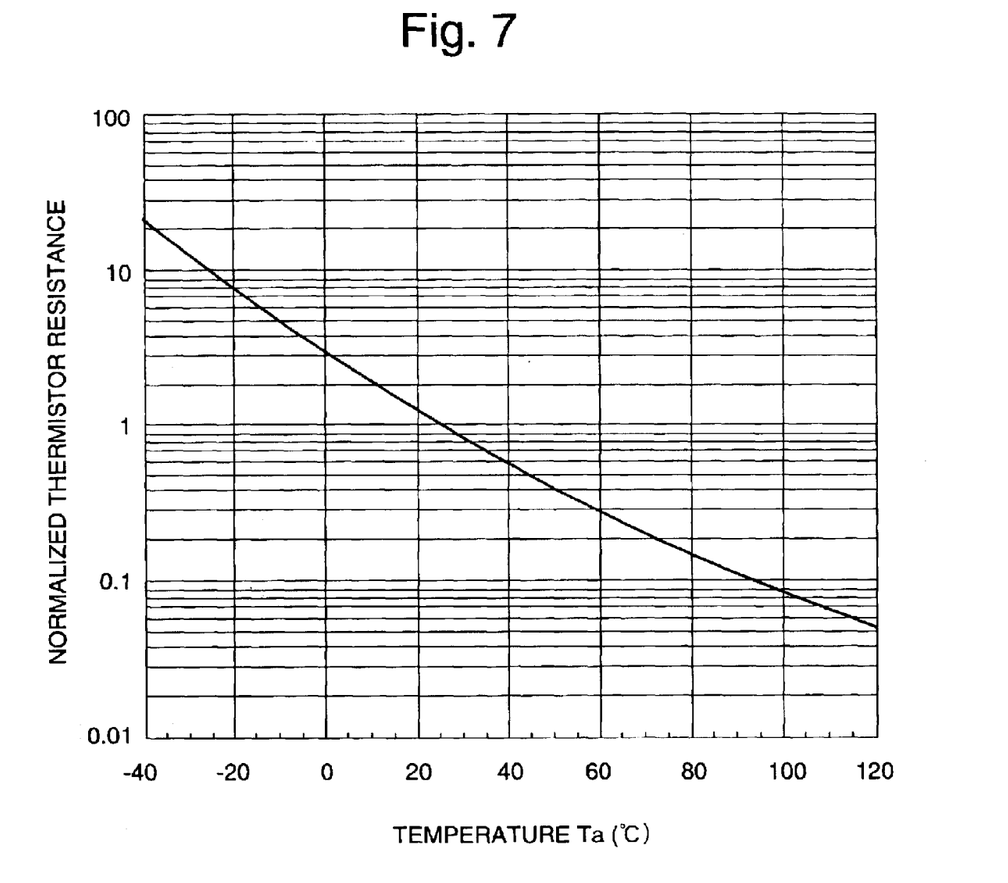
FIG. 7 shows temperature-dependent variations in the resistance of the thermistor.

Here, one example of the temperature-dependence of a typical thermistor as a thermosensitive resistance element is illustrated in FIG. 7.

The resistance of the thermistor is expressed as normalized at the standard temperature of +25° C. The resistance at −40° C. is greater than that at +25° C. by one digit, while the resistance at +120° C. is smaller than that at +25° C. by one digit.

In the following description, for the sake of understanding ease, the resistances of the fixed resistance elements 21 and 22 are supposed to be the same value (Ra). It is further supposed that, at the standard ambient temperature Ta of operation=+25° C., the resistance of the fixed resistance element 21 is so set that the resistance of the thermistor 23 be smaller than that of the fixed resistance element 21 by one digit and the resistance of the fixed resistance element 22 is so set that the resistance of the thermistor 24 be greater than that of the fixed resistance element 22 by one digit.

First, the combined resistance of the first parallel connection (the fixed resistance element 21 and the thermistor 23) 27 is substantially determined by the resistance (Ra/10) of the thermistor 23 at the standard ambient temperature Ta of operation=+25° C.

As the resistance of the thermistor 23 at a low ambient temperature Ta of operation=−40° C. is greater than that at the standard ambient temperature Ta of operation=+25° C. by one digit or so, the resistance of the fixed resistance element 21 and that of the thermistor 23 have the same number of digits, and the combined resistance of the first parallel connection 27 will be approximately half (Ra/2) that of the fixed resistance element 21. Conversely, at a high ambient temperature Ta of operation=+120° C., as the resistance of the thermistor 23 is smaller than that at the standard ambient temperature Ta of operation=+25° C. by one digit or so, it will become smaller than the resistance of the fixed resistance element 21 by two digits, with the result that the combined resistance of the first parallel connection 27 is determined by the resistance (Ra/100) of the thermistor 23.

Similarly, the combined resistance of the second parallel connection (the fixed resistance element 22 and the thermistor 24) 28 is substantially determined by the resistance (Ra) of the fixed resistance element 22 at the standard ambient temperature Ta of operation=+25° C.

At a low ambient temperature Ta of operation=−40° C., as the resistance of the thermistor 24 is greater than that at the standard ambient temperature Ta of operation=+25° C. by one digit or so, it will become greater than that of the fixed resistance element 22 by two digits, with the result that the combined resistance of the parallel part is determined by the resistance (Ra) of the fixed resistance element 22. Conversely, at a high temperature Ta=+120° C., as the resistance of the thermistor 23 is smaller than that at the standard ambient temperature Ta of operation=+25° C. by one digit or so, the resistance of the fixed resistance element 22 and that of the thermistor 24 have the same number of digits, approximately half (Ra/2) the resistance at the standard temperature.

Figure 8:
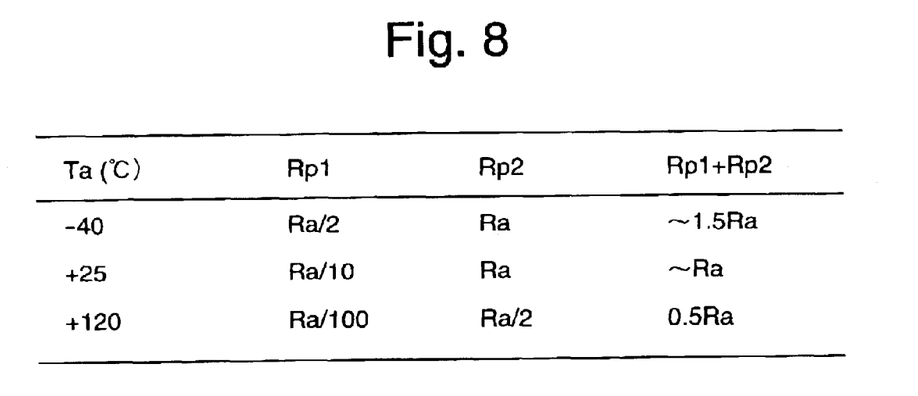
FIG. 8 shows the combined resistance of first and second parallel connections and their serial resistances relative to the ambient temperature of operation.

The foregoing description reveals that the serial combined resistance (Rp1+Rp2) of the first parallel connection (with a resistance of Rp1) consisting of the fixed resistance element 21 and the thermistor 23 and the second parallel connection (with a resistance of Rp2) of the fixed resistance element 22 and the thermistor 24 manifests a temperature characteristic forming a primary inclination relative to the ambient temperature Ta of operation as shown in FIG. 8.

Figure 9:
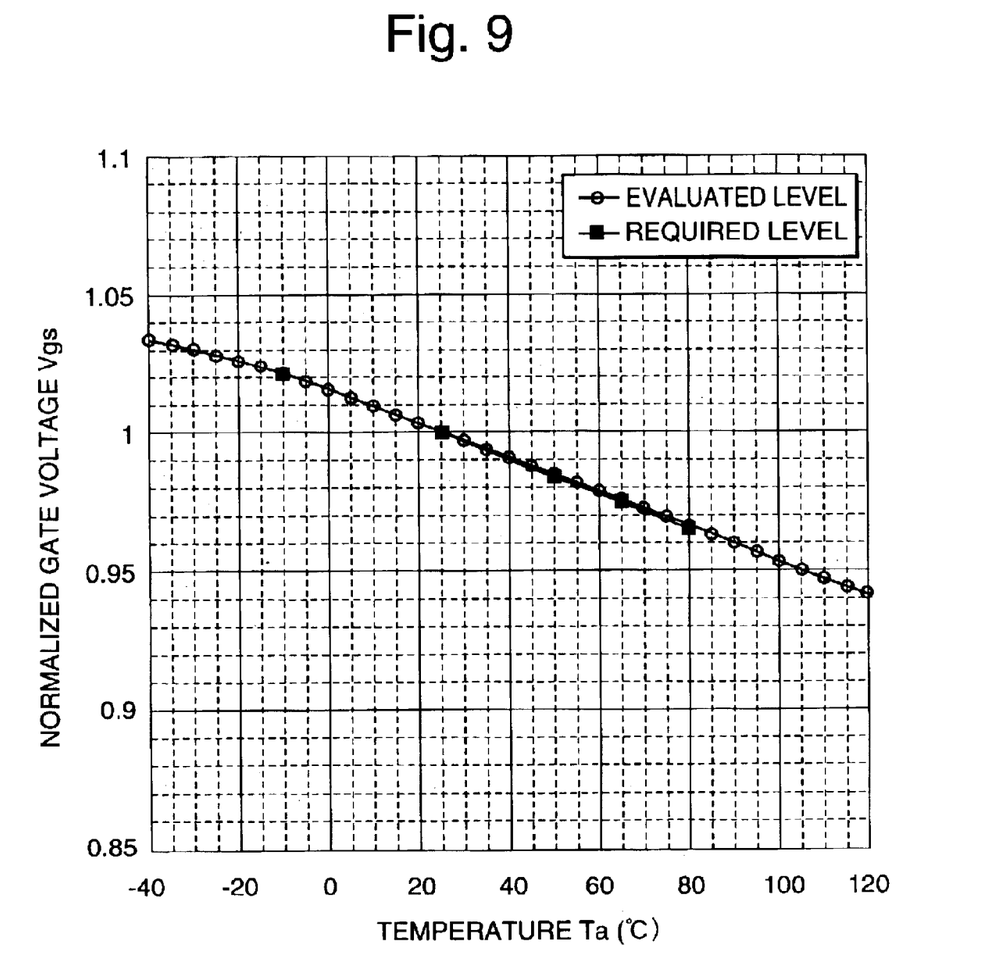
FIG. 9 shows the temperature compensation characteristic of the invention.

FIG. 9 shows the evaluated Vgs value of the gate voltage obtained by using a temperature-compensating circuit for which the fixed resistance elements 25 and 26 were appropriately selected. In this diagram, the required level of the gate voltage Vgs to keep constant the drain current Ids obtained from FIG. 3 is overlapped. According to FIG. 9, the two curves well agree with each other, indicating that temperature compensation can be achieved in the range of the ambient temperature Ta of operation from −10° C. to +80° C.

Figure 10:
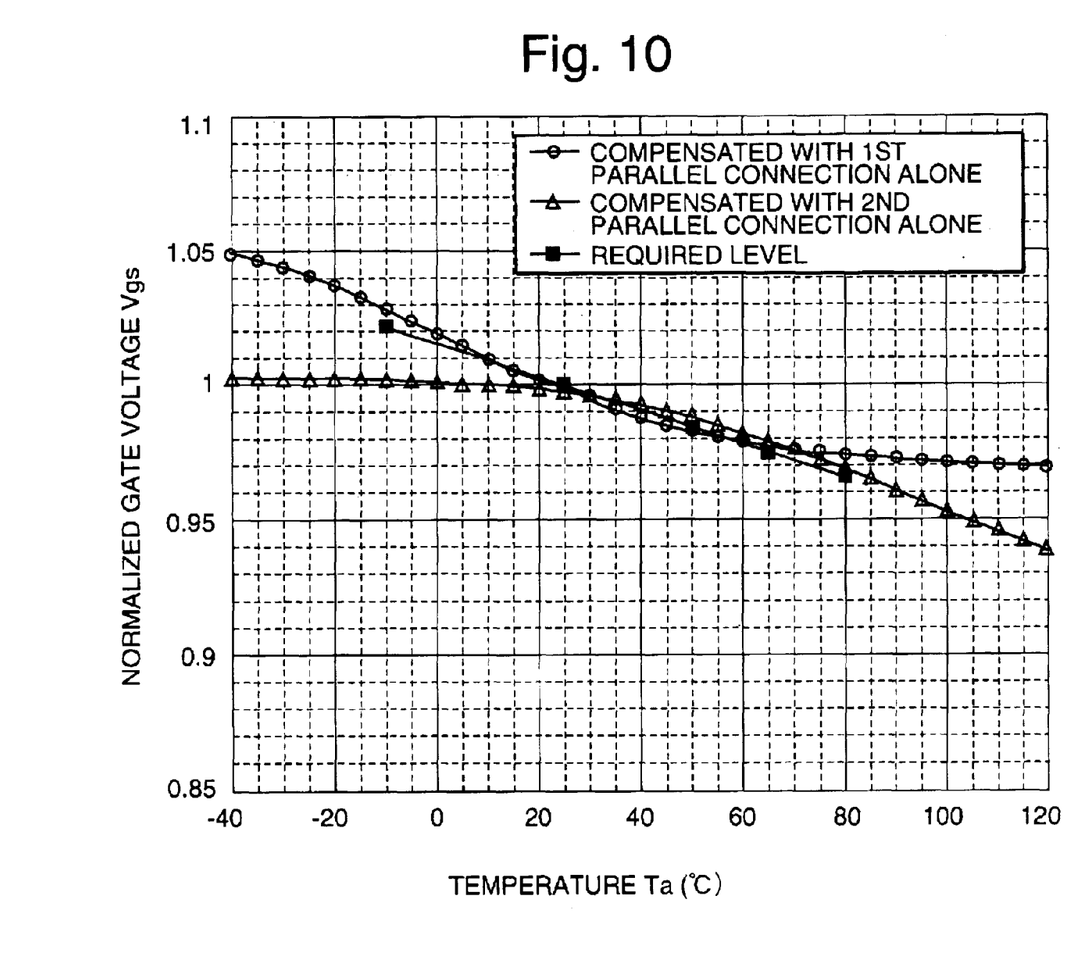
FIG. 10 is a temperature compensation characteristic diagram with one of the thermistors being deemed to be a fixed resistance element.

FIG. 10 is a temperature compensation characteristic diagram with one of the thermistors 23 and 24 in the circuit of FIG. 8 being deemed to be a fixed resistance element and only the other varying with the temperature.

FIG. 10 shows that the first parallel connection unit (the fixed resistance element 21 and the thermistor 23) contributes to linear compensation in the lower-temperature region and the second parallel connection unit (the fixed resistance element 22 and the thermistor 24), to the linear compensation in the higher-temperature region.

Figure 11:
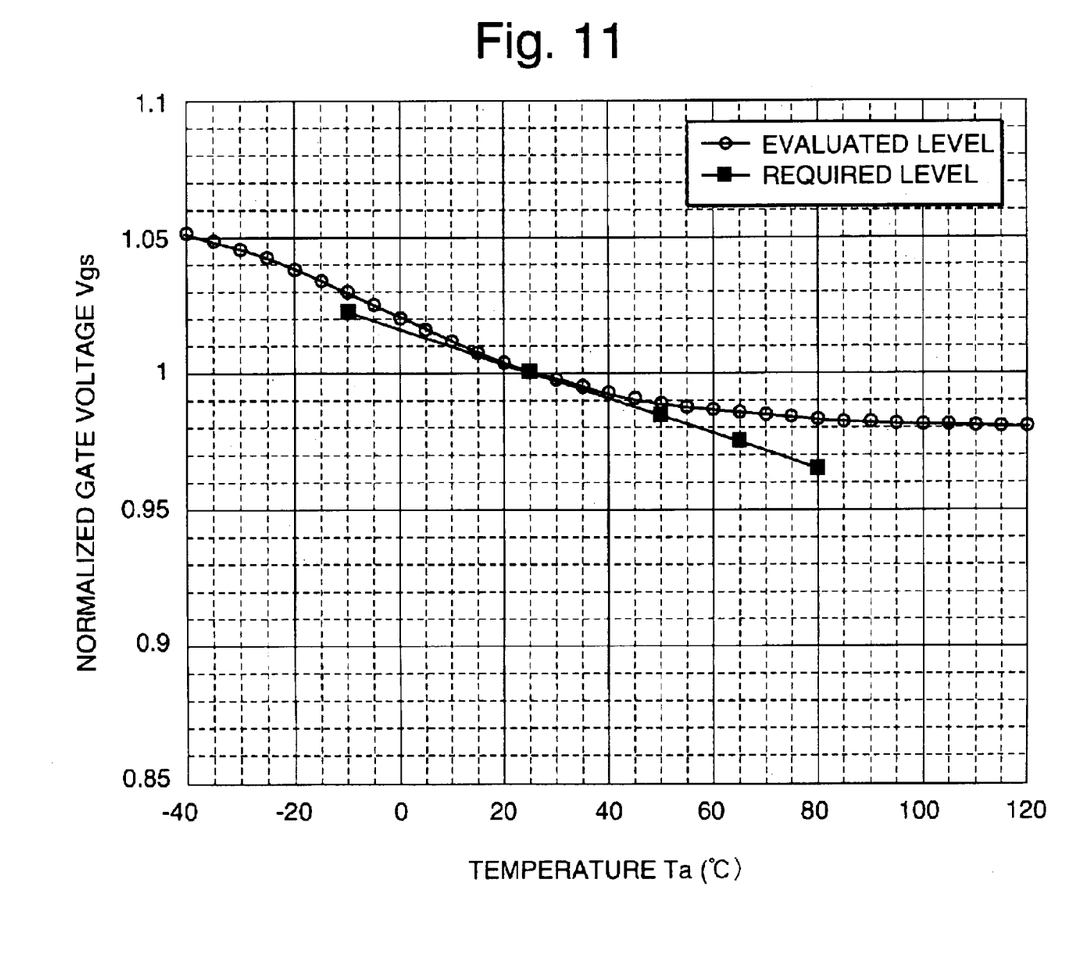
FIG. 11 is a temperature compensation characteristic diagram with a temperature-compensating circuit according to the prior art being applied to the LDMOS FET.

Hereupon, with a view to emphasizing the effectiveness of the present invention, the temperature-dependence of the gate voltage of the temperature-compensating circuit using a thermistor according to the prior art shown in FIG. 1 is graphically shown in FIG. 11. In FIG. 11, the assessed level of the gate voltage generated by the temperature-compensating circuit as the temperature varies is expressed in a curve linking white circles. Against that, the required level of the gate voltage to keep Ids constant irrespective of temperature variations is expressed in a curve (straight line) linking black squares. Thus the temperature range in which the two curves coincide with each other, namely the temperature range in which linear compensation is possible, is around 30° C. It is difficult for the temperature-compensating circuit according to the prior art shown in FIG. 1 to compensate the gate voltage in a broad temperature range.

As hitherto described, according to the present invention, it is made possible to accurately accomplish temperature compensation which minimizes the worsening of the distortion-susceptibility of an LDMOS FET amplifier by appropriately selecting the temperature characteristic or resistance of the thermosensitive resistance element and the resistances of the fixed resistance elements 21 and 22 connected in parallel and of the fixed resistance elements 25 and 26 connected in series.

Although the foregoing description supposed that temperature compensation by the temperature-compensating circuit according to the invention centered on the standard ambient temperature Ta of operation=+25° C., it can be applied to any other desired temperature.

As hither stated, with the temperature-compensating circuit and FET amplifier according to the invention, it is made possible to keep the drain current amperage of the LDMOS FET amplifier constant to result in the advantage of minimizing the worsening of the distortion-susceptibility by providing a circuit network in which at least two stages of a pair of a fixed resistance element and a thermosensitive resistance element each connected in parallel are connected in series in a gate bias circuit.

While the present invention has been described with reference to a certain preferred embodiment thereof, it is to be understood that the subject matter encompassed by the present invention is not limited to this specific embodiment. Instead, it is intended to include all such alternatives, modifications, and equivalents as can be included within the spirit and scope of the following claims.

What is claimed is:

1. A FET amplifier, using a FET as its amplifying element, provided with a temperature-compensating circuit for subjecting the gate voltage of said FET element to temperature compensation, wherein:

the source of said FET is grounded, and said temperature-compensating circuit compensates said gate voltage so as to keep the drain current of said FET element constant at a prescribed amperage against variations in ambient temperature, wherein:

the prescribed amperage of said drain current is an amperage at which third order cross modulation distortion in the output power of said FET amplifier is minimized.

2. A FET amplifier, using a FET as its amplifying element, provided with a temperature-compensating circuit for subjecting the gate voltage of said FET element to temperature compensation, wherein:

said temperature-compensating circuit compensates said gate voltage so as to keep the drain current of said FET element constant at a prescribed amperage against variations in ambient temperature, wherein: said temperature-compensating circuit is provided with:

a resistance circuit in which a first parallel circuit formed by a first fixed resistance element whose resistance does not vary dependent on the temperature and a first thermosensitive resistance element whose resistance does vary dependent on the temperature and a second parallel circuit formed of a second fixed resistance element and a second thermossensitive resistance element are connected in series, and a third fixed resistance element, wherein:

a voltage divided by said resistance circuit and said third fixed resistance element is applied as said gate voltage.

3. The FET amplifier, as claimed in claim 2, wherein:

said first fixed resistance element and said second fixed resistance element have either the same resistance or resistances of the same number of digits, the resistance of said first thermosensitive resistance element at the normal temperature is smaller than that of said first fixed resistance element by one digit, and the resistance of said second thermosensitive resistance element at the normal temperature is greater than that of said second fixed resistance element by one digit.

4. The FET amplifier, as claimed in claim 2, wherein: said first thermosensitive resistance element and said second thermosensitive resistance element are thermistors.

5. The FET amplifier, as claimed in claim 1, wherein: the amplifying element of said FET amplifier is an LDMOS FET (lateral diffused MOS field effect transistor).

6. A FET amplifier, using a FET as its amplifying element, provided with a temperature-compensating circuit for subjecting the gate voltage of said FET element to temperature compensation, wherein:

the source of said FET is grounded, said temperature-compensating circuit compensates said gate voltage so as to keep the drain current of said FET element constant at a prescribed amperage against variations in ambient temperature, wherein a compensable temperature range of said FET is at least from −10° C. to +80° C., and said temperature-compensation circuit comprises a parallel resistor network including at least one resistor of a fixed value and at least one thermo-sensitive resistor which varies in value according to temperature.

7. A FET amplifier, using a FET as its amplifying element, provided with a temperature-compensating circuit for subjecting the gate voltage of said FET element to temperature compensation, wherein:

the source of said FET is directly grounded, said temperature-compensating circuit compensates said gate voltage so as to keep the drain current of said FET element constant at a prescribed amperage against variations in ambient temperature, and said temperature-compensation circuit comprises a parallel resistor network including at least one resistor of a fixed value and at least one thermo-sensitive resistor which varies in value according to temperature.

* * * * *